United States Patent
Buggenthin et al.

(10) Patent No.: US 11,467,568 B2
(45) Date of Patent: Oct. 11, 2022

(54) METHOD FOR COMPUTER-AIDED PROCESSING OF QUALITY INFORMATION OF AN OBJECT AND A RESPECTIVE ASSISTANCE APPARATUS

(71) Applicant: Siemens Aktiengesellschaft, Munich (DE)

(72) Inventors: Felix Buggenthin, Munich (DE); Siegmund Düll, Munich (DE); Mitchell Joblin, Munich (DE); Clemens Otte, Munich (DE); Axel Reitinger, Munich (DE); Victor Balanica, Ingolstadt (DE); Michael Caelers, Norrköping (SE); Jonas Eriksson, Finspong (SE); Jerry Fornander, Finspang (SE); Andreas Graichen, Norrköping (SE); Vincent Sidenvall, Örkelljunga (SE)

(73) Assignee: SIEMENS AKTIENGESELLSCHAFT

( * ) Notice: Subject to any disclaimer, the term of this patent is extended or adjusted under 35 U.S.C. 154(b) by 126 days.

(21) Appl. No.: 16/647,931

(22) PCT Filed: Sep. 21, 2018

(86) PCT No.: PCT/EP2018/075556
§ 371 (c)(1),
(2) Date: Mar. 17, 2020

(87) PCT Pub. No.: WO2019/063422
PCT Pub. Date: Apr. 4, 2019

(65) Prior Publication Data
US 2020/0264594 A1    Aug. 20, 2020

(30) Foreign Application Priority Data
Sep. 26, 2017  (EP) .................................... 17193156

(51) Int. Cl.
*G06F 3/048*     (2013.01)
*G05B 19/418*    (2006.01)
(Continued)

(52) U.S. Cl.
CPC ...... *G05B 19/41875* (2013.01); *B29C 64/386* (2017.08); *B33Y 50/00* (2014.12);
(Continued)

(58) Field of Classification Search
CPC .... G05B 19/41875; G05B 2219/32222; G05B 2219/49023; G05B 19/4099; B33Y 50/00;
(Continued)

(56) References Cited

U.S. PATENT DOCUMENTS

| | | | |
|---|---|---|---|
| 11,073,824 B1 * | 7/2021 | Chapman | B33Y 50/00 |
| 2006/0156246 A1 | 7/2006 | Williams et al. | |

(Continued)

FOREIGN PATENT DOCUMENTS

| | | |
|---|---|---|
| CN | 1804839 A | 7/2006 |
| CN | 101192057 A | 6/2008 |

(Continued)

OTHER PUBLICATIONS

PCT International Search Report and Written Opinion of International Searching Authority dated Jun. 11, 2018 corresponding to PCT International Application No. PCT/EP2018/075556 filed Sep. 21, 2018.

*Primary Examiner* — Aleksey Olshannikov
(74) *Attorney, Agent, or Firm* — Schmeiser, Olsen & Watts LLP

(57) ABSTRACT

Provided is a method for computer-aided processing of quality information of an object manufactured by stacked printed layers in an additive manufacturing system, including the steps of: receiving a quality indicator for each printed layer of the object from the manufacturing system, assigning
(Continued)

a color out of a predefined set of colors to each quality indicator depending on the value of the quality indicator, visualizing the quality indicators of the received manufactured layers as a sequence of colored bars ordered according to the sequence of the manufactured layers the color of each bar indicating the value of the quality indicator of the respective printed layer on a graphical user interface.

16 Claims, 2 Drawing Sheets

(51) Int. Cl.
    *B33Y 50/00*     (2015.01)
    *B29C 64/386*     (2017.01)
    *G06F 3/0482*     (2013.01)
(52) U.S. Cl.
    CPC .. *G06F 3/0482* (2013.01); *G05B 2219/32222* (2013.01); *G05B 2219/49023* (2013.01); *G06F 2203/04806* (2013.01)
(58) Field of Classification Search
    CPC ....... B33Y 99/00; B33Y 50/02; B29C 64/386; G06F 3/0482; G06F 2203/04806; G06F 30/00; B22F 10/30; B22F 10/20; Y02P 10/25; Y02P 90/02
    See application file for complete search history.

(56) References Cited

U.S. PATENT DOCUMENTS

| | | |
|---|---|---|
| 2010/0091050 A1 | 4/2010 | El-Ghoroury et al. |
| 2012/0170840 A1 | 7/2012 | Hasegawa |
| 2013/0095302 A1 | 4/2013 | Pettis et al. |
| 2015/0248755 A1 | 9/2015 | Vagman et al. |
| 2015/0269289 A1* | 9/2015 | Kim .................... G06F 30/20 703/6 |
| 2016/0092408 A1 | 3/2016 | Farouki et al. |
| 2016/0179064 A1 | 6/2016 | Arthur et al. |
| 2016/0184893 A1 | 6/2016 | Dave et al. |
| 2018/0322621 A1* | 11/2018 | Craeghs ............... B23K 26/342 |
| 2019/0018400 A1* | 1/2019 | McCann ............... B33Y 30/00 |
| 2019/0293550 A1 | 9/2019 | Hess et al. |

FOREIGN PATENT DOCUMENTS

| | | |
|---|---|---|
| CN | 102177720 A | 9/2011 |
| CN | 103403711 A | 11/2013 |
| CN | 103412871 A | 11/2013 |
| CN | 104881863 A | 9/2015 |
| CN | 106257366 A | 12/2016 |
| CN | 106575308 A | 4/2017 |
| DE | 102013003760 A1 | 9/2014 |
| WO | WO 2017085468 A1 | 5/2017 |

\* cited by examiner

METHOD FOR COMPUTER-AIDED PROCESSING OF QUALITY INFORMATION OF AN OBJECT AND A RESPECTIVE ASSISTANCE APPARATUS

CROSS-REFERENCE TO RELATED APPLICATIONS

This application claims priority to PCT Application No. PCT/EP2018/075556, having a filing date of Sep. 21, 2018, based on EP 17193156.1, having a filing date of Sep. 26, 2017, the entire contents both of which are hereby incorporated by reference.

FIELD OF TECHNOLOGY

The following relates to a method and an assistance apparatus as well as a computer-program product for computer-aided processing of quality information of an object manufactured by stacked printed layers in an additive manufacturing system.

BACKGROUND

Additive manufacturing or layer based manufacturing is a cutting-edge part production process that starts with a modeling phase by segmenting a 3-dimensional (3D) object model into stacked 2-dimensional (2D) layers of different thickness and continues with the actual production phase by printing one layer upon a previous layer. In powder bed fusion additive manufacturing, one of several existing additive manufacturing processes, two alternating steps are performed. In a recoating step material powder is spread on a flat surface e.g. of a previously processed layer creating a so-called powder bead. In a subsequent exposure step the material powder is exposed and fused to the previous layer.

Though very fast and flexible in creating objects, e.g. low cost prototypes, building parts, spare parts, the manufacturing process is affected by several problems like powder spread issues, exposure issues, gas flow issues or recoating issues. Depending on the height of the object and the layer thickness, the number of 2D-layers needed to produce the object is very big, e.g. thousands of layers, and time needed to print all the layers can take days.

Taken into account the weak robustness of the additive manufacturing process due to the possible issues mentioned above, different counter acting measures are available providing a quality indicator, e.g. indicating a fault probability, on each layer.

US 2016/179064 A1 discloses a method providing a visual representation to users of data collected from a 3D-additive manufacturing process. A user device receives process data associated with the manufacturing process, transforms them into visualization data compatible with a computer-aided design specification, receives a Boolean query, and then renders a visual depiction on a display. The visual depiction is an image of a work piece where the pixel value in the image corresponds to melt pool temperature or a Boolean relationship of different sensor values.

DE 10 2013 003760 A1 discloses a method providing a first data set comprising location resolved color values which are each related to a temperature of a part at a related location of the part. This first data set is compared with a second data set comprising the same kind of data of a reference part at a related reference location of the part. Depending on the determined differences of the two data sets the quality of the part can be judged.

The overall quality of the already printed object during the printing process or a completed object, depends in most cases not on a single layer with bad quality, but is caused by several layers of minor quality and depending on the fault type occurring in that layer.

SUMMARY

An aspect relates to determining overall quality information for any print job, i.e. for any printed object, composed of thousands of layers fast and easily, even in online mode during the manufacturing process of the printed object even some layers ahead, automatically or by a user.

The expression "manufacturing" and "printing" as well as combinations with other terms like "manufacturing process" and "printing process" or "manufactured layer" or "printed layer" are used as synonyms throughout this document.

According to the first aspect this is solved concretely by a method for computer-aided processing of quality information of an object manufactured by stacked printed layers in an additive manufacturing system, comprising the steps of
receiving a quality indicator for each printed layer of the object from the manufacturing system,
assigning a color out of the predefined set of colors to each quality indicator depending on the value of the quality indicator,
visualizing the quality indicators of the received manufactured layers as a sequence of colored bars ordered according to the sequence of the manufactured layers the color of each bar indicating the value of the quality indicator of the respective printed layer on a graphical user interface.

The method steps of receiving, assigning and visualizing can be repeatedly performed when applied online during the manufacturing process. The method can also be applied after the manufacturing process receiving quality indicators of all manufactured layers of the completely printed object. A manufacturing system may comprise beside the 3D-printer also further monitoring and diagnostic components evaluating and calculating a quality indicator. Diagnostic components can e.g. determine fault probabilities for each layer based on offline or online sensor data evaluations and output the fault probability as a quality indicator. The quality indicator may be formed by one single value processed to indicate the quality of the layer, e.g. indicating a fault probability or a fault value out of a predefined set of fault values indicating a most critical fault type. The quality indicator may comprise additional information, e.g. most significant sensor data measured during printing the observed layer, any further fault indicators identified for the layer or an indicator that no failure or fault was detected for the observed layer.

The method transforms a numerical value of the quality indicator for each layer into a colored bar and puts all bars together to create a representative color barcode for the entire executed additive manufacturing job. A user can immediately observe the different color bars and identify if there are issues with the printing job. By ordering the colored bars in sequence of the manufactured layers the position of low quality layers within the printed object, a pattern of varying quality layers can be identified easily. Identified pattern can be compared to known fault pattern to judge or evaluate the overall object quality or object quality indicator. The sequence of bars provides an additive manufacturing health bar code as a user interface element enabling a quick health check and track of the performing or performed additive manufacturing print job. This allows fast observation, supervision, maintenance and reaction to a user.

In a preferred embodiment the method comprises the additional steps of selecting a subset of one or several bars out of the sequence of bars, and providing information on the layers of the selected subset. This allows the identification of fault pattern even if the layers are close to each other and will not be resolved in a sequence bar showing all layers of the object.

In a preferred embodiment the method an object quality indicator depending on the color variation of the ordered sequence of bars is transferred to the manufacturing system indicating the quality of the overall object built by the manufactured layers. This has the technical advantage that an immediate feedback to the manufacturing system can be provided to trigger means in the manufacturing system. Such means can be an adaption of manufacturing parameters or even a termination of the printing process.

In a further preferred embodiment assigning the color is performed by normalizing the quality indication value to a quality indicator number in a predefined interval and mapping the quality indicator numbered a color scale, especially a gradient interval between two chosen colors. This has the technical advantage that a large number of different quality indicator values can be differentiated and visualized easily. An operator can immediately observe the different colored bars and identify issues in the processing or processed job.

Using a gradient between two chosen colors intuitively reflects increasing or decreasing quality. E.g. assigning gradient colors from green colored bars identifying a "good" layer of high quality, for which no action is required, to red colored bars identifying "bad" layers for which the user must take action or analyze closely.

In a preferred embodiment of the method the total number of layers is mapped to a maximum number of displayable bars, which can be displayed on the graphical user interface, the displayable bars are displayed according to the order of the mapped layers and colored according to the quality indicator value of the most significant layer in respective displayable bar. This embodiment has the technical advantage to highlight layers with a low quality indicator. The most significant layer is the at least one layer showing the lowest quality indicator.

In a third preferred embodiment the lowest sequence number of the layer presented by the first bar and the highest sequence number of the layer represented by the last bar are indicated close to the respective bar in the sequence of bars. This has the technical advantage to easily recognize the presented subset of layers with respect to an overall number of layers of the object.

In a further preferred embodiment, a minimum context element and a maximum context element is displayed adjacent to each border of the displayed sequence bars indicating the color and/or additional information about the layer with the highest or lowest quality indicator value of the displayed layers. This has the technical advantage to quickly identify and therefore evaluate subsets of bars with respect to layers of low quality indicator.

In a further preferred embodiment, the graphical user interface provides means for selecting a subset of bars resulting in a zoom-in displaying the subset of bars on an enlarged width. This has the technical effect to obtain additional or full information on the selected layer.

In a further preferred embodiment, the graphical user interface providing means for selecting a neighboring bar results in displaying additionally the layer number and the additional information of the neighboring bar. This has the technical effect to quickly analyze e.g. layers around a layer of bad quality indicator value.

According to a second aspect this is solved concretely by an assistant apparatus for processing a quality information of an object manufactured by stacked printed layers in an additive manufacturing system, comprising a receiving unit configured to receive a quality indicator value for each printed layer of the object, an assignment unit configured to assign a color out of a set of colors depending on the value of the quality indicators to each quality indicator value and a graphical user interface, configured to visualize the quality indicators of the received manufactured layers as a sequence of colored bars ordered according to a sequence of the printed layers, the color of the bar indicating the value of the quality indicator of the manufactured layer. The assistance apparatus has the same technical advantage as the method according to the first aspect.

In a preferred embodiment the assistance apparatus comprises additionally a selecting unit configured to select a subset of one or several bars out of the sequence of bars and a providing unit, configured to provide information on the layers of the selected subset. This has the technical advantage, to consider a subset of bars in more detail.

In a preferred embodiment the assistance apparatus additionally comprises a transferring unit configured to transfer an object quality indicator depending on the color variation of the ordered sequence of bars to the manufacturing system indicating an evaluated quality of the overall object built up by the printed layers. This has the technical advantage to feedback an evaluated quality of the overall object to the manufacturing system and to adapt the manufacturing system on short notice and automatically.

According to a third aspect the object is solved concretely by a computer program product (non-transitory computer readable storage medium having instructions, which when executed by a processor, perform actions) with program code means stored on a machine readable data carrier to perform all steps of the claimed method, when the program is performed on a computing device, like a programmable computer or a digital signal processor.

BRIEF DESCRIPTION

Some of the embodiments will be described in detail, with reference to the following figures, wherein like designations denote like members, wherein.

DETAILED DESCRIPTION

Figure 1:
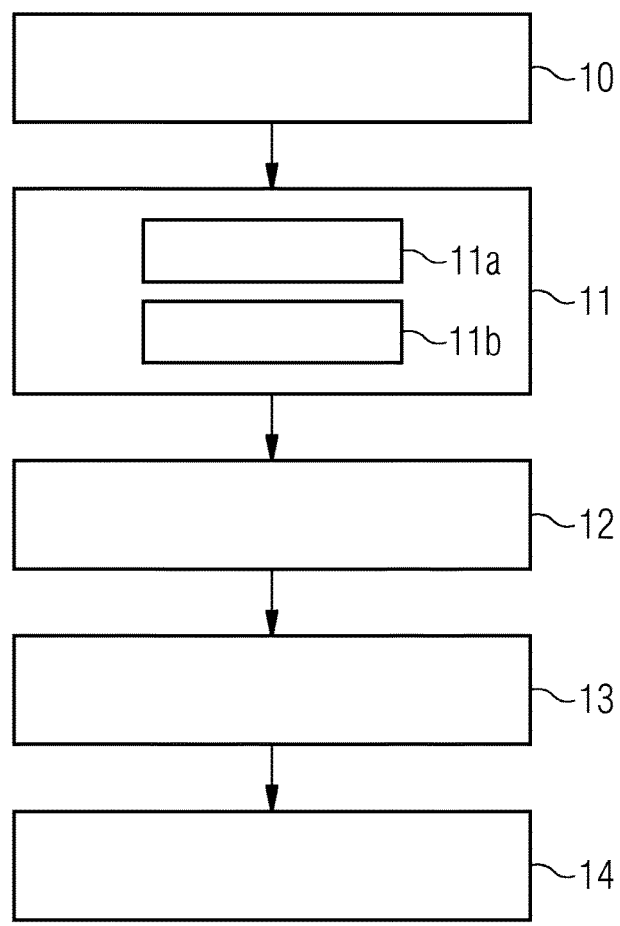
FIG. 1 shows a block diagram of an embodiment of the inventive method.

FIG. 1 shows a block diagram of a method for computer-aided processing of quality information of an object manufactured by stacked printed layers in an additive manufacturing system. In the manufacturing system each printed layer is evaluated e.g. by any online/offline classifier or regression model based on sensor data resulting in a quality indicator for each layer. In a first step 10 a quality indicator for each printed layer of the object is received from the manufacturing system. The receiving step can be performed either once to receive quality indicators for all printed layers of the object after the manufacturing process is finalized. The receiving process can also be performed to receive each single quality indicator for each single printed layer during a running manufacturing process or it can contain quality indicators for several printed layers.

In next step 11 a color out of a predefined set of colors is assigned to each quality indicator depending on the value of the quality indicators. In a preferred embodiment the value of the quality indicator is normalized to a numerical value, e.g. in an interval between 0 and 1, see step 11a. A corresponding color value of the bar is computed by a normalization step that maps the numerical value of the quality indicator to the value inside the gradient interval between two chosen colors, see step 11b.

Then the quality indicators of the received manufactured layers is visualized as a sequence of colored bars ordered according to the sequence of the manufactured layers, the color of each bar indicating the value of the quality indicator of the respective manufactured layer, see step 12.

The sequence of bars forming a bar code is created by transforming the numerically normalized quality indicator for each layer into a color normalized bar and putting all bars together in the user interface element in order to create a representative colored "health" barcode for the entire object printed in an executed print job. A user can immediately observe the different colored bars and recognize if there are issues with the processing/processed job. In a preferred embodiment, a color gradient between green color and red color is used, see FIG. 5. The green bars identify the good layers for which the classifier returned no unusual behavior, and, conversely, the red bars identify the bad layers for which the operator must retain attention and analyze closely.

This sequence of colored bars forms a so called additive manufacturing health barcode, in short health barcode, that allows a quick health check and track of the performing or performed additive manufacturing printing job, which in turn favors fast operate actions like observation, supervision, maintenance and reaction on the printing process.

In a preferred embodiment a subset of one or several bars out of the sequence of bars can be selected in an additional step 13 and information is provided on the layers of the selected subset in step 14.

Step 13 and 14 allow an operator to analyze the situation on dedicated layers and to receive further information to assist in this analysis. This analysis may result in assigning an object quality indicator for the object formed by the represented layers depending on the color variation of the ordered sequence of bars. This object quality indicator can be derived e.g. by comparing the color variation of the ordered sequence of bars with different predefined color variations which are indicating different fault categories or quality values for the overall object. The object quality indicator can be derived either automatically by an assistance apparatus or by a user.

This object quality indicator is transferred back to the manufacturing system to adapt the printing process accordingly. The object quality indicator can be represented by a warning signal triggering an alarm in the monitoring panel or device of the manufacturing system. The object quality indicator can also be represented by a value interpreted in the manufacturing system to adapt settings in the printing process.

Figure 2:
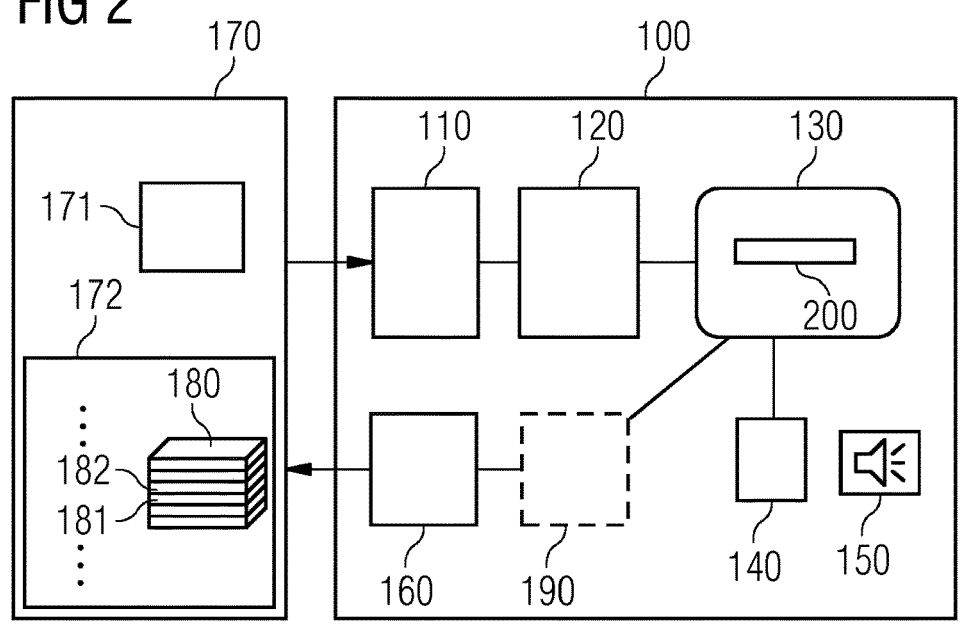
FIG. 2 shows a schematic view of an embodiment of the inventive assistance apparatus communicating with a manufacturing system.

FIG. 2 shows an embodiment of an assistance apparatus 100 connected to an additive manufacturing system 170. The additive manufacturing system 170 comprises a 3D-printer 172 manufacturing an object 180 by printing on layers 181, 182 stacked on each other. The additive manufacturing system 170 may comprise a layer diagnostics component 171 evaluating a quality indicator for each layer. This can be done by analyzing imaging data and/or further data collected by respective sensors in the 3D printer 172. The diagnostic component 171 provides quality indicator values which are received in a receiving unit 110 of the assistance apparatus 100.

In an assignment unit 120 the color is assigned to the quality indicator value received for the layer and transferred to a graphical user interface 130 which is configured to visualize the received quality indicators of the layers in a sequence of colored bars 200 forming a health barcode. A selecting unit 140 is configured for selecting a subset of one or several bars out of the sequence of bars 200. The selecting unit can be e.g. a mouse or a touch pen to select bars on the graphical user interface 130. The providing unit 150 is configured to provide information on the layers of the selected subset. The providing unit 150 can be a part of the graphical user interface displaying the requested information. It can also be a speaker which outputs the information in form of voice. A transferring unit 160 is configured to transfer an object quality indicator depending on the color variation of the colored sequence of bars to the manufacturing system indicating an evaluated quality of the overall object built up by the manufactured layers. An optional evaluation unit 190 is configured to evaluate an object quality indicator for the overall object automatically.

The described units can be built up by one or several processors building up a programmable computer or a digital signal processor.

Figure 3:
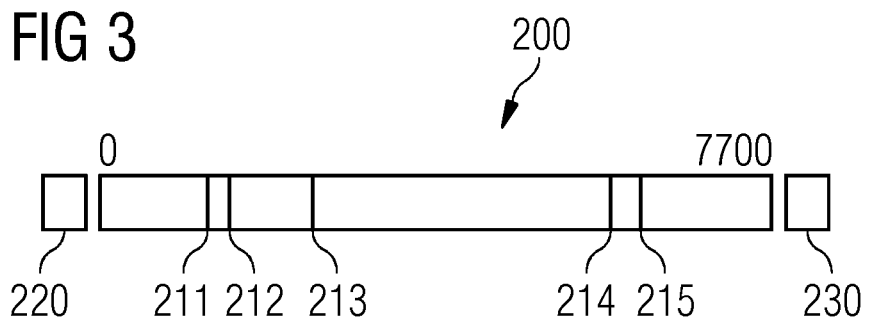
FIG. 3 shows a first graphical user interface element generated based on an embodiment of the inventive method.
Figure 4:
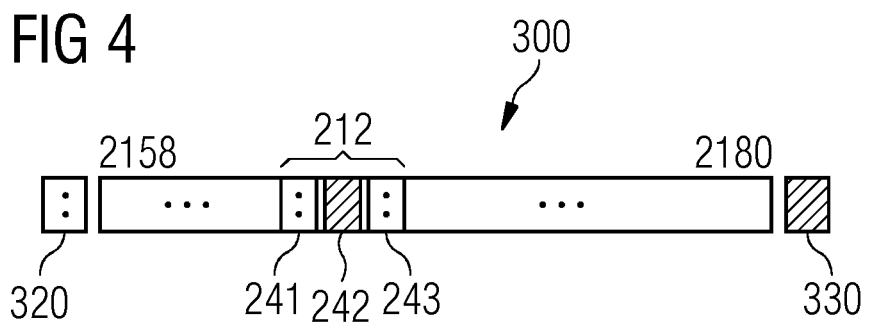
FIG. 4 shows a second graphical user interface element generated based on an embodiment of the inventive method.
Figure 5:
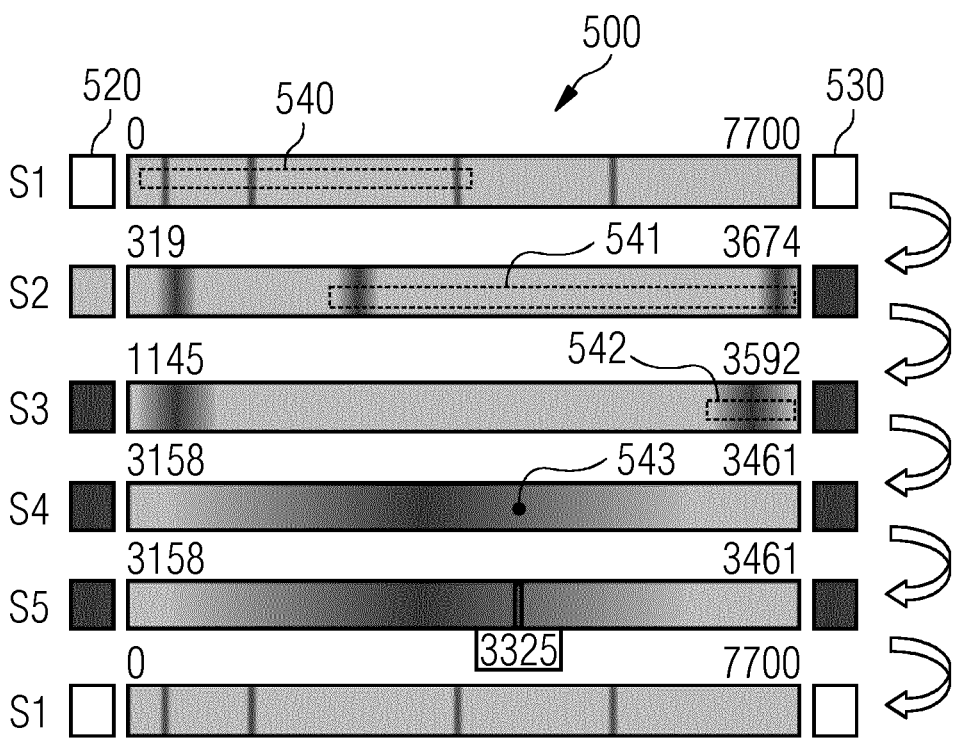
FIG. 5 shows several embodiments of graphical user interface elements generated based on embodiments of the inventive method.

FIG. 3 to FIG. 5 show example embodiments of health barcodes 200, 300, 500 comprising a sequence of bars representing the quality indicator value of layers of an object during or after the printing process.

FIG. 3 shows a sequence of quality indicator bars forming a barcode 200. Bars representing a layer with a very low quality index are displayed in black color like e.g. bars 211 to 215. All other layers and respectively bars in this example show a high quality indicator and are therefore shown in a bright color. They are not explicitly visible in FIG. 3. Above the borders of the barcode 200 the lowest and highest numbers of the shown layers are indicated here from layer 0 to layer 7700.

A minimum context element 220 and a maximum context element 230 are displayed adjacent to each border of the displayed barcode 200 indicating the color and/or additional information about the layer with the most significant, i.e., the highest or lowest quality indicator value of the displayed layers.

FIG. 4 shows a subset of bars representing layer 2158 to 2180. Such a selection can be performed by using a dragging window moved over the subset of bars to be displayed. Single bar can now be clearly distinguished, see bars 241, 242, 243. Accordingly, the minimum context element 320 shows the color of the highest quality indicator value here for example the same value as bar 241, 243 wherein the maximum context element 330 shows the color of the lowest quality indicator value which is here the color of bar 242.

In many cases the number of layers is very high and not each single bar can be displayed. E.g. the number of displayable bars is limited to the number of pixels in a line of a user interface element. In this case the total number of layers is divided into subsets of adjacent layers each subset of layers is represented by only one bar. The color of the layer with the lowest quality indicator inside the subset is assigned the bar representing the subset. These bars are ordered according the sequence of the layers and form the barcode.

FIG. 5 shows four action which can be performed by the graphical user interface and the resulting health bar representation. The color value of a bar is computed by a normalization step that maps the numerical value of the quality indicator the value inside the gradient interval between two chosen colors, here a green color with color code #C8E5B3, and a red color with color code #EA2803. The graphical user interface element S1 visualizes a health bar 500 of all available layers, here up to the layer 7700. Update of the health bar with additional received layers may be performed on request.

A subset of bars can be selected by a dragging window 540 resulting in barcode 500 shown in S2 showing the selected set of bars. The numbers of the first and last displayed layer, here layer 319 and layer 3674, are indicated above the border of the health bar in the graphical user interface element S2.

Minimum context element 520 and maximum context element 530 in graphical user interface element S1 show no color for the barcode including all layers. For the subset of bars shown in S2 the minimum context element shows the color, here green, for the lowest quality indicator value in the represented subset. Maximum context element 530 shows red color which is the color value of the bar with the lowest quality indicator value. A further zoom-in is performed selecting in bar S2 with dragging window 541 results in a subset of bars which are then shown in graphical user interface element S3. Here the minimum and maximum context element changed according to the selected set of bars.

A further zooming in is indicated by dragging window 542 and results in barcode in S4. By marking a dedicated bar indicated by dot 543, information like the layer number the bar is representing is displayed, see barcode in S5. Further information, e.g. error codes sensor values measured or calculated for that layer can be displayed in addition. A further selection performed, e.g., by a selection unit like a mouse or a touch pen, results in the overview barcode in S1 which shows an overview over the initial printing job layers.

The resulting interactive user interface element allows a user to quickly visualize a quality of all printed layers in an print additive manufacturing print job. Each and every printed layer can be visualized in form of a colored bar, where the color maps the layer fault severity. An object quality indicator can be easily derived automatically or by a user.

All methods can be implemented by corresponding means which are adapted for performing the respective method steps. All functions provided by particular means can be a method step of the method.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A method for computer-aided processing of quality information of an object manufactured by stacked printed layers in an additive manufacturing system, comprising the steps of:
receiving a quality indicator for each printed layer of the object from the manufacturing system;
assigning a color out of a predefined set of colors to each quality indicator for each respective printed layer of the object depending on the value of the respective quality indicator; and
visualizing the quality indicators of the printed layers as a sequence of colored bars ordered according to the sequence of the printed layers, the color of each bar indicating the value of the respective quality indicator of the respective printed layer on a graphical user interface.

2. The method according to claim 1, comprising additional steps of:
selecting a subset of one or several bars out of the sequence of bars; and
providing information on the layers of the selected subset.

3. The method according to claim 1, comprising a step of:
transferring an object quality indicator depending on the color variation of the ordered sequence of bars to the manufacturing system indicating the evaluated quality information of the overall object build up by the printed layers.

4. The method according to claim 1, wherein assigning the color is performed by:
normalizing the quality indicator value to a quality indicator number in a predefined interval; and
mapping the quality indicator number to a color scale, especially to a gradient interval between two chosen colors.

5. The method according to claim 1, wherein the total number of layers is mapped to a maximum number of bars displayable on the graphical user interface, the displayable bars are displayed according to the order of the mapped layers and colored according to the quality indicator value of the most significant layer in the respective displayable bar.

6. The method according to claim 1, wherein the lowest sequence number of the layer represented by the first bar and the highest sequence number of the layer represented by the last bar are indicated close to the respective bar in the sequence of bars.

7. The method according to claim 1, wherein a minimum context element and a maximum context element are displayed adjacent to each border of the displayed sequence of bars, indicating the color and/or additional information about the layer with the highest or lowest quality indicator value of the displayed layers.

8. The method according to claim 1, wherein the graphical user interface provides a manner of selecting one bar of the displayed sequence of bars results in displaying the layer number and additional information of the selected bar.

9. The method according to claim 8, wherein the graphical user interface provides a manner for selecting a neighboring bar resulting in displaying additionally the layer number and additional information of the neighboring bar.

10. The method according to claim 1, wherein the graphical user interface provides a manner for selecting a subset of bars resulting in a zoom-in displaying the subset of bars on an enlarged width.

11. An assistance apparatus for processing a quality information of an object manufactured by stacked printed layers in an additive manufacturing system, comprising:

at least one processor configured to:

receive a quality indicator value for each printed layer of the object;

assign a color out of a set of colors to each quality indicator value for each respective printed layer of the object depending on the respective quality indicator value; and visualize the quality indicator values of the printed layers as a sequence of colored bars ordered according to the sequence of the printed layers, the color of the bar indicating the value of the quality indicator of the printed layer.

12. The assistance apparatus according to claim 11, wherein the at least one processor is further configured to:

select a subset of one or several bars out of the sequence of bars; and provide information on the layers of the selected subset.

13. The assistance apparatus according to claim 11, wherein the at least one processor is further configured to:

transfer an object quality indicator depending on the color variation of the ordered sequence of bars to the manufacturing system indicating an evaluated quality of the overall object build up by the printed layers.

14. A computer program product, comprising a computer readable hardware storage device having computer readable program code stored therein, said program code executable by a processor of a computer system to implement the method of claim 1, when the program is performed on a programmable computer or a digital signal processor.

15. The method according to claim 1, wherein fault probabilities are determined for the respective printed layer based on offline or online sensor evaluations and the fault probabilities are output as the quality indicator.

16. The assistance apparatus according to claim 11, wherein fault probabilities are determined for the respective printed layer based on offline or online sensor evaluations and the fault probabilities are output as the quality indicator value.

* * * * *